(12) United States Patent
Zanbaghi et al.

(10) Patent No.: US 10,009,039 B1
(45) Date of Patent: Jun. 26, 2018

(54) MULTI-PATH ANALOG SYSTEM WITH MULTI-MODE HIGH-PASS FILTER

(71) Applicant: Cirrus Logic International Semiconductor Ltd., Edinburgh (GB)

(72) Inventors: Ramin Zanbaghi, Austin, TX (US); Daniel J. Allen, Austin, TX (US); John L. Melanson, Austin, TX (US); Aniruddha Satoskar, Round Rock, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days. days.

(21) Appl. No.: 15/681,023

(22) Filed: Aug. 18, 2017

(51) Int. Cl.
  *H03M 1/12* (2006.01)
  *H03M 1/18* (2006.01)
  (Continued)

(52) U.S. Cl.
  CPC .......... *H03M 1/188* (2013.01); *H03H 19/004* (2013.01); *H04R 3/04* (2013.01)

(58) Field of Classification Search
  CPC ........ H03M 1/188; H03H 19/004; H04R 3/04
  (Continued)

(56) References Cited

U.S. PATENT DOCUMENTS

| | | | | |
|---|---|---|---|---|
| 4,400,693 A | * | 8/1983 | Flamm | H04N 7/24 341/136 |
| 5,706,008 A | * | 1/1998 | Huntley, Jr. | H03M 1/0682 341/156 |

(Continued)

FOREIGN PATENT DOCUMENTS

JP          01143517 A       6/1989

OTHER PUBLICATIONS

Mohan et al., Highpass and bandpass 2nd-order switched-capacitor filters; Institution of Electrical Engineers, IET Digital Library, vol. 130, Issue 1, Feb. 1983, p. 1-6.
(Continued)

*Primary Examiner* — Brian Young
(74) *Attorney, Agent, or Firm* — Jackson Walker L.L.P.

(57) ABSTRACT

A system may comprise a high-pass filter having an input for receiving an input signal, an output for generating an output signal, a capacitor coupled between the input and the output, a switched-capacitor resistor coupled between the output and a reference voltage, and control circuitry configured to control the reference voltage to cancel current leakage into a circuit coupled to the output. The input, the output, the capacitor, and the switched-capacitor resistor may be arranged to generate the output signal as a high-pass filtered version of the input signal and the high-pass filter may be configured to operate in a plurality of modes comprising at least a high-impedance mode and a low-impedance mode in which the resistance of the switched-capacitor resistor is significantly smaller than the resistance when in the high-impedance mode.

A system may include a plurality of processing paths having a first path configured to generate a first digital signal based on an analog input signal and a second path configured to generate a second digital signal based on the analog input signal, the second path having a high-pass filter for filtering the analog input signal prior to the analog input signal being processed by the remainder of the second path, and the high-pass filter having a corner frequency. Control circuitry may be configured to determine frequency-dependent weighted proportions of the first and second digital signals to be combined into an output digital signal based on a characteristic of the analog input signal. Frequency-dependent weighted proportions may be such that the digital output signal includes spectral content of the first digital signal below the corner frequency to account for spectral content of the second digital signal below the corner frequency being filtered.

(Continued)

A system may include an input for receiving an input signal, an output for generating an output signal, a capacitor coupled between the input and the output, a variable resistor coupled to the output and having a plurality of modes including a first mode in which the variable resistor has a first resistance and a second mode in which the variable resistor has a second resistance, and control circuitry configured to determine a difference between the input signal and the output signal and switch between modes of the plurality of modes when the difference is less than a predetermined threshold.

12 Claims, 6 Drawing Sheets

(51) Int. Cl.
*H04R 3/04* (2006.01)
*H03H 19/00* (2006.01)

(58) Field of Classification Search
USPC .......................................................... 341/155
See application file for complete search history.

(56) References Cited

U.S. PATENT DOCUMENTS

| | | | |
|---|---|---|---|
| 5,818,656 A | 10/1998 | Klaassen et al. | |
| 6,392,575 B1* | 5/2002 | Eklund | H03M 1/0673 |
| | | | 341/118 |
| 6,781,361 B2* | 8/2004 | Nestler | G01R 21/127 |
| | | | 324/142 |
| 8,638,165 B2 | 1/2014 | Shah et al. | |
| 9,071,267 B1 | 6/2015 | Schneider et al. | |
| 9,430,105 B2 | 8/2016 | Yao et al. | |
| 2012/0068868 A1 | 3/2012 | Ahmed et al. | |

OTHER PUBLICATIONS

Combined Search and Examination Report under Sections 17 and 18(3), UKIPO, Application No. GB1715822.1, dated Mar. 27, 2018.
Combined Search and Examination Report under Sections 17 and 18(3), UKIPO, Application No. GB1715821.3, dated Mar. 27, 2018.
Combined Search and Examination Report under Sections 17 and 18(3), UKIPO, Application No. GB1715823.9, dated Mar. 27, 2018.

* cited by examiner

MULTI-PATH ANALOG SYSTEM WITH MULTI-MODE HIGH-PASS FILTER

FIELD OF DISCLOSURE

The present disclosure relates in general to signal processing systems, and more particularly, to multiple path signal processing systems.

BACKGROUND

The use of multipath analog-to-digital converters (ADCs) and analog front ends (AFEs) (e.g., two or more path ADCs/AFEs) in electrical circuits is known. Example multipath ADCs and AFEs and use of them in multiple electrical circuit paths are disclosed in U.S. Pat. No. 5,714,956 entitled "Process and System for the Analog-to-Digital Conversion of Signals" to Jahne et al. ("Jahne patent"), U.S. Pat. No. 5,600,317 entitled "Apparatus for the Conversion of Analog Audio Signals to a Digital Data Stream" to Knoth et al. ("Knoth patent") and U.S. Pat. No. 6,271,780 entitled "Gain Ranging Analog-to-Digital Converter with Error Correction" to Gong et al. ("Gong patent"). The use of multipath circuits may reduce noise as one path may be optimized for processing small amplitude signals (e.g., for processing low noise signals) while another circuit path with another set of ADC and AFE is optimized for large amplitude signals (e.g., allowing for higher dynamic range).

An example application for multipath ADCs/AFEs is use of it in a circuit for an audio system application, such as an audio mixing board or in a digital microphone system. Such an example application is disclosed in the Jahne patent. In designing a circuit with multipath ADCs/AFEs that are used in respective multiple circuit paths, a tradeoff may exist between allowing larger signal swing (e.g., to allow swing of a signal between larger scale amplitudes) and low noise. Furthermore, the multipath ADCs/AFEs may provide high dynamic range signal digitization, with higher dynamic range for a given input power, and lower overall area than would be possible with conventional means. In other words, by allowing a separate optimization for each type of signal (e.g., large and small signals) that is provided each respective path, multipath ADCs/AFEs allow the overall circuit to burn less power, consume less area, and save on other such design costs.

Despite their advantages, existing multipath ADC/AFE approaches have disadvantages and problems. For example, many existing approaches have disadvantages related to transitioning and switching between the multiple paths, as such switching may not be smooth, leading to undesirable signal artifacts, especially in audio applications in which such artifacts may be perceptible to a listener of an audio device. As another example, a trend in electric circuits is to scale circuitry to the integrated circuit level.

However, existing approaches to multipath AFEs/ADCs do not scale well to the integrated circuit level.

SUMMARY

In accordance with the teachings of the present disclosure, certain disadvantages and problems associated with implementation of multiple AFE/ADC paths may be reduced or eliminated.

In accordance with embodiments of the present disclosure, a system may include a plurality of processing paths and control circuitry. The plurality of processing paths may include a first processing path configured to generate a first digital signal based on an analog input signal and a second processing path configured to generate a second digital signal based on the analog input signal. The control circuit may be configured to determine weighted proportions of the first digital signal and the second digital signal to be combined into an output digital signal based on a characteristic of the analog input signal. The second processing path may include a high-pass filter for filtering the analog input signal prior to the analog input signal being processed by the remainder of the second processing path, the high-pass filter comprising an input for receiving an input signal, an output for generating an output signal, a capacitor coupled between the input and the output, and a switched-capacitor resistor coupled to the output. The input, the output, the capacitor, and the switched-capacitor resistor may be arranged to generate the output signal as a high-pass filtered version of the input signal. The high-pass filter may be configured to operate in a plurality of modes comprising at least a high-impedance mode in which the control circuitry causes the switching frequency of switched capacitors of the switched-capacitor resistor to be such that the switched-capacitor resistor has a first resistance and a low-impedance mode in which the switched-capacitor resistor has a second resistance significantly smaller than first resistance.

In accordance with these and other embodiments of the present disclosure, a system may comprise a high-pass filter having an input for receiving an input signal, an output for generating an output signal, a capacitor coupled between the input and the output, a switched-capacitor resistor coupled between the output and a reference voltage, and control circuitry configured to control the reference voltage to cancel current leakage into a circuit coupled to the output. The input, the output, the capacitor, and the switched-capacitor resistor may be arranged to generate the output signal as a high-pass filtered version of the input signal, and the high-pass filter may be configured to operate in a plurality of modes comprising at least a high-impedance mode and a low-impedance mode in which the resistance of the switched-capacitor resistor is significantly smaller than the resistance when in the high-impedance mode.

In accordance with these and other embodiments of the present disclosure, a method may include processing an analog input signal with a first processing path to generate a first digital signal based on the analog input signal, processing the analog input signal with a second processing path to generate a second digital signal based on the analog input signal, and determining weighted proportions of the first digital signal and the second digital signal to be combined into an output digital signal based on a characteristic of the analog input signal. The method may also include high-pass filtering, with a high-pass filter, the analog input signal prior to the analog input signal being processed by the remainder of the second processing path, the high-pass filter comprising an input for receiving an input signal, an output for generating an output signal, a capacitor coupled between the input and the output, and a switched-capacitor resistor coupled to the output. The input, the output, the capacitor, and the switched-capacitor resistor may be arranged to generate the output signal as a high-pass filtered version of the input signal. The method may further include operating the high-pass filter in a plurality of modes comprising at least a high-impedance mode in which the switching frequency of switched capacitors of the switched-capacitor resistor is such that the switched-capacitor resistor has a first resistance and a low-impedance mode in which the switched-capacitor resistor has a second resistance significantly smaller than first resistance.

In accordance with these and other embodiments of the present disclosure, a method may include receiving an input signal at an input of a high-pass filter, generating an output signal at an output of the high-pass filter, wherein the input, the output, a capacitor coupled between the input and the output, and a switched-capacitor resistor coupled between the output and a reference voltage are arranged to generate the output signal as a high-pass filtered version of the input signal, and operating the high-pass filter in a plurality of modes comprising at least a high-impedance mode and a low-impedance mode in which the resistance of the switched-capacitor resistor is significantly smaller than the resistance when in the high-impedance mode.

In accordance with these and other embodiments of the present disclosure, a system may include a plurality of processing paths and control circuitry. The plurality of processing paths may include a first processing path configured to generate a first digital signal based on an analog input signal and a second processing path configured to generate a second digital signal based on the analog input signal, the second processing path having a high-pass filter for filtering the analog input signal prior to the analog input signal being processed by the remainder of the second processing path, and the high-pass filter having a corner frequency. The control circuitry may be configured to determine frequency-dependent weighted proportions of the first digital signal and the second digital signal to be combined into an output digital signal based on a characteristic of the analog input signal. The frequency-dependent weighted proportions may be configured such that the digital output signal includes spectral content of the first digital signal below the corner frequency to account for the spectral content of the second digital signal below the corner frequency being filtered by the high-pass filter.

In accordance with these and other embodiments of the present disclosure, a method may include processing an analog input signal with a first processing path to generate a first digital signal based on the analog input signal, processing the analog input signal with a second processing path to generate a second digital signal based on the analog input signal, the second processing path having a high-pass filter for filtering the analog input signal prior to the analog input signal being processed by the remainder of the second processing path, and the high-pass filter having a corner frequency, and determining frequency-dependent weighted proportions of the first digital signal and the second digital signal to be combined into an output digital signal based on a characteristic of the analog input signal. The frequency-dependent weighted proportions may be configured such that the digital output signal includes spectral content of the first digital signal below the corner frequency to account for the spectral content of the second digital signal below the corner frequency being filtered by the high-pass filter.

In accordance with these and other embodiments of the present disclosure, a system may include an input for receiving an input signal, an output for generating an output signal, a capacitor coupled between the input and the output, a variable resistor coupled to the output and having a plurality of modes including a first mode in which the variable resistor has a first resistance and a second mode in which the variable resistor has a second resistance, and control circuitry configured to determine a difference between the input signal and the output signal, and switch between modes of the plurality of modes when the difference is less than a predetermined threshold.

In accordance with these and other embodiments of the present disclosure, a method may include, in a system having an input for receiving an input signal, an output for generating an output signal, a capacitor coupled between the input and the output, and a variable resistor coupled to the output and having a plurality of modes including a first mode in which the variable resistor has a first resistance and a second mode in which the variable resistor has a second resistance: determining a difference between the input signal and the output signal; and switching between modes of the plurality of modes when the difference is less than a predetermined threshold.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
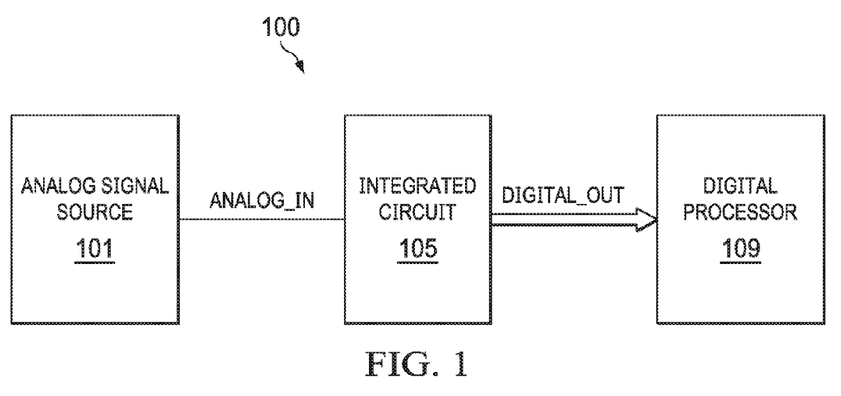
FIG. 1 illustrates a block diagram of selected components of an example signal processing system, in accordance with embodiments of the present disclosure.

FIG. 1 illustrates a block diagram of selected components of an example signal processing system 100, in accordance with embodiments of the present disclosure. As shown in FIG. 1, signal processing system 100 may include an analog signal source 101, an integrated circuit (IC) 105, and a digital processor 109. Analog signal source 101 may comprise any system, device, or apparatus configured to generate an analog electrical signal, for example an analog input signal ANALOG_IN. For example, in embodiments in which signal processing system 100 is a processing system, analog signal source 101 may comprise a microphone transducer.

Integrated circuit 105 may comprise any suitable system, device, or apparatus configured to process analog input signal ANALOG_IN to generate a digital output signal DIGITAL_OUT and condition digital output signal DIGITAL_OUT for transmission over a bus to digital processor 109. Once converted to digital output signal DIGITAL_OUT, the signal may be transmitted over significantly longer distances without being susceptible to noise as compared to an analog transmission over the same distance. In some embodiments, integrated circuit 105 may be disposed in close proximity with analog signal source 101 to ensure that the length of the analog line between analog signal source 101 and integrated circuit 105 is relatively short to minimize the amount of noise that can be picked up on an analog output line carrying analog input signal ANALOG_IN. For example, in some embodiments, analog signal source 101 and integrated circuit 105 may be formed on the same substrate. In other embodiments, analog signal source 101 and integrated circuit 105 may be formed on different substrates packaged within the same integrated circuit package.

Digital processor 109 may comprise any suitable system, device, or apparatus configured to process a digital output signal for use in a digital system. For example, digital processor 109 may comprise a microprocessor, microcontroller, digital signal processor (DSP), application specific integrated circuit (ASIC), or any other device configured to interpret and/or execute program instructions and/or process data, such as digital output signal DIGITAL_OUT.

Signal processing system 100 may be used in any application in which it is desired to process an analog signal to generate a digital signal. Thus, in some embodiments, signal processing system 100 may be integral to an audio device that converts analog signals (e.g., from a microphone) to digital signals representing the sound incident on a microphone. As another example, signal processing system 100 may be integral to a radio-frequency device (e.g., a mobile telephone) to convert radio-frequency analog signals into digital signals.

Figure 2:
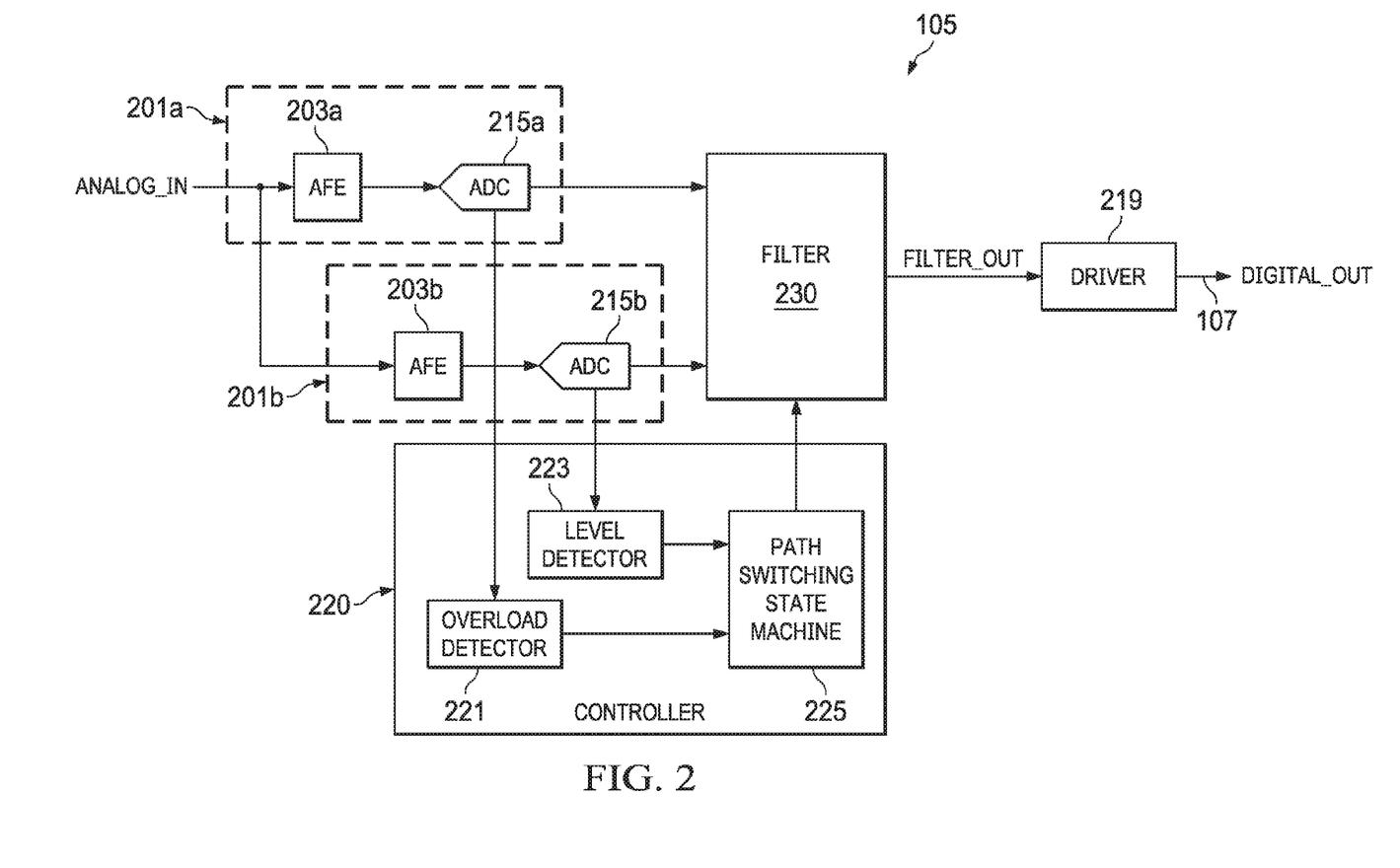
FIG. 2 illustrates a block diagram of selected components of an integrated circuit for processing an analog signal to generate a digital signal, in accordance with embodiments of the present disclosure.

FIG. 2 illustrates a block diagram of selected components of integrated circuit 105, in accordance with embodiments of the present disclosure. As shown in FIG. 2, integrated circuit 105 may include two or more processing paths 201*a* and 201*b* (which may be referred to herein individually as a processing path 201 and collectively as processing paths 201), each processing path 201 including a respective AFE 203 (e.g., AFE 203*a*, AFE 203*b*) and a respective ADC 215 (e.g., ADC 215*a*, ADC 215*b*). An AFE 203 may receive analog input signal ANALOG_IN via one or more input lines which may allow for receipt of a single-ended signal, differential signal, or any other suitable analog signal format and may comprise any suitable system, device, or apparatus configured to condition analog input signal ANALOG_IN for processing by ADC 215. Selected components for example embodiments of AFEs 203*a* and 203*b* are discussed in greater detail below with respect to FIG. 3. The output of each AFE 203 may be communicated to a respective ADC 215 on one or more output lines.

An ADC 215 may comprise any suitable system, device, or apparatus configured to convert an analog signal received at its input, to a digital signal representative of analog input signal ANALOG_IN. ADC 215 may itself include one or more components (e.g., delta-sigma modulator, decimator, etc.) for carrying out the functionality of ADC 215. Selected components for the example embodiments of ADCs 215*a* and 215*b* are discussed in greater detail below with respect to FIG. 3.

Filter 230 may comprise any suitable system, device, or apparatus configured to, based on a corner frequency of filter 230, control the relative contributions of the digital signals output by processing paths 201*a* and 201*b* to a digital output signal FILTER_OUT generated by filter 230. For example, as such corner frequency increases, the contribution of the digital signal output by processing path 201*a* may become less dominant in digital output signal FILTER_OUT while the contribution of the digital signal output by processing path 201*b* may become more dominant in digital output signal FILTER_OUT. Conversely, as such corner frequency decreases, the contribution of the digital signal output by processing path 201*a* may become more dominant in digital output signal FILTER_OUT while the contribution of the digital signal output by processing path 201*b* may become less dominant in digital output signal FILTER_OUT. Thus, filter 230 may effectively serve as a combined filter which low-pass filters the digital signal output by processing path 201*b* and high-pass filters the digital signal output by processing path 201*a* and combines the filtered digital signals to generate digital output signal FILTER_OUT such that digital output signal FILTER_OUT includes the spectral components of digital signal output by processing path 201*b* lower than the corner frequency and includes the spectral components of digital signal output by processing path 201*a* higher than the corner frequency. Example embodiments of filter 230 are described in greater detail below with respect to FIGS. 3 and 4.

Controller 220 may comprise any suitable system, device, or apparatus for controlling a corner frequency of filter 230. In some embodiments, controller 220 may perform such control based on a magnitude of analog input signal ANALOG_IN or a signal derivative thereof. For example, controller 220 may include an overload detector 221 that may determine whether or not a signal derivative of analog input signal ANALOG_IN (e.g., a signal generated within ADC 215*a*) is likely to cause clipping or other distortion of digital output signal DIGITAL_OUT if a particular processing path (e.g., processing path 201*a*) is the dominant component of digital output signal DIGITAL_OUT. If clipping or other distortion of digital output signal DIGITAL_OUT is likely if the particular processing path (e.g., processing path 201*a*) is dominant, path switching state machine 225 of controller 220 may generate a control signal to increase a corner frequency of filter 230 such that such processing path 201*a* becomes less dominant. To further illustrate, in some embodiments, processing path 201*a* may be a path adapted for low amplitudes of analog input signal ANALOG_IN and may thus have a high signal gain, while processing path 201*b* may be a path adapted for higher amplitudes of analog input signal ANALOG_IN and may thus have a lower signal gain. Thus, if analog input signal ANALOG_IN or a derivative thereof is greater than a threshold value indicative of a condition whereby digital output signal DIGITAL_OUT may experience clipping or other distortion if processing path 201*a* is dominant, overload detector 221 may detect such condition, and cause path switching state machine 225 to generate a control signal to increase the corner frequency of filter 230 in order to make processing path 201*a* less dominant in digital output signal DIGITAL_OUT.

As another example, controller 220 may include a level detector 223 that may detect an amplitude of analog input signal ANALOG_IN or a signal derivative thereof (e.g., a signal generated within ADC 215*b*) and communicate a signal indicative of such amplitude to path switching state machine 225. Responsive to the signal received from level detector 223, path switching state machine 225 may generate a control signal communicated to filter 230. To illustrate, as analog input signal ANALOG_IN decreases from a relatively high amplitude to a lower amplitude, it may cross a threshold amplitude level whereby controller 220 may decrease the corner frequency of filter 230, in order to make the output of processing path 201a more dominant in digital output signal DIGITAL_OUT and the output of processing path 201b less dominant in digital output signal DIGITAL_OUT. In some embodiments, path switching state machine 225 may wait for passage of a predetermined time after crossing of the threshold level before beginning to decrease the corner frequency. When decreasing the corner frequency, path switching state machine 225 may do so continuously or in steps as the magnitude of the analog input signal decreases. Similarly, when below the threshold amplitude level, path switching state machine 225 may cause the corner frequency to increase in response to increasing magnitude of the analog input signal.

Driver 219 may receive the filtered digital output signal FILTER_OUT generated by filter 230. Driver 219 may comprise any suitable system, device, or apparatus configured to condition such digital signal (e.g., encoding into Audio Engineering Society/European Broadcasting Union (AES/EBU), Sony/Philips Digital Interface Format (S/PDIF)), in the process generating conditioned digital output signal DIGITAL_OUT for transmission over a bus to digital processor 109. In FIG. 2, the bus receiving conditioned digital output signal DIGITAL_OUT is shown as single-ended. In some embodiments, driver 219 may generate a differential conditioned digital output signal 107.

Figure 3:
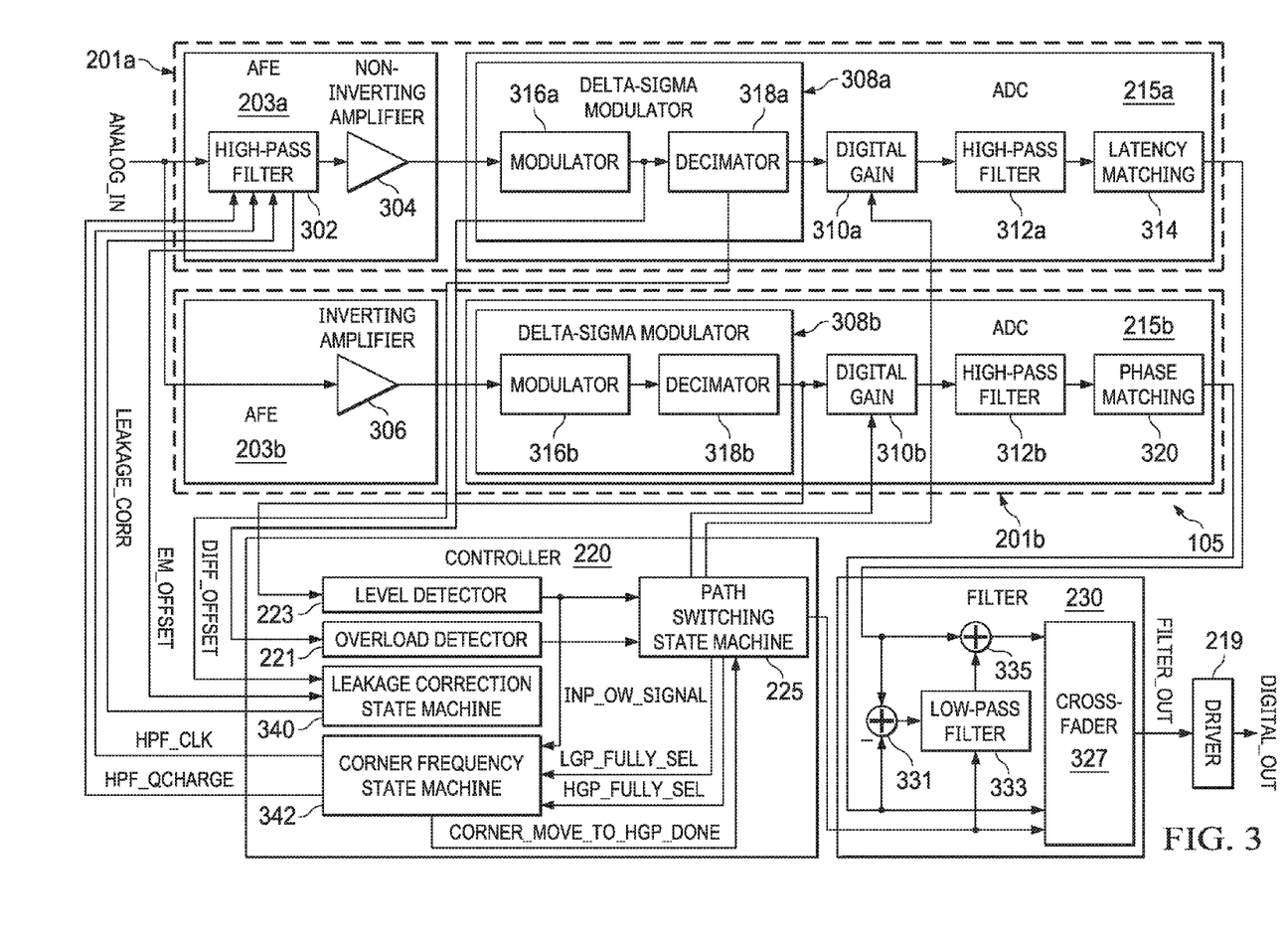
FIG. 3 illustrates a block diagram of selected components of the integrated circuit of FIG. 2 depicting selected components of example embodiments of analog front ends, analog-to-digital converters, and a filter, in accordance with embodiments of the present disclosure.

FIG. 3 illustrates a block diagram of selected components of integrated circuit 105 depicting selected components of example embodiments of AFEs 203, ADCs 215, and filter 230, in accordance with embodiments of the present disclosure. As shown in FIG. 3, analog front end 203a of processing path 201a may include a high-pass filter 302 configured to high-pass filter analog input signal ANALOG_IN to remove direct current offsets or biases, which are often particularly troublesome for high-gain amplifiers, and output such filtered signal to a non-inverting amplifier 304. Non-inverting amplifier 304 may amplify analog input signal ANALOG_IN by a non-inverting gain and communicate such amplified analog signal to ADC 215a. In some embodiments, high-pass filter 302 may be formed on the same integrated circuit as one or more of AFE 203a, AFE 203b, ADC 215a, and ADC 215b. Because of the presence of high-pass filter 302 in processing path 201a, but not processing path 201b, processing paths 201 may each have a different frequency response to analog input signal ANALOG_IN.

Figure 4A:
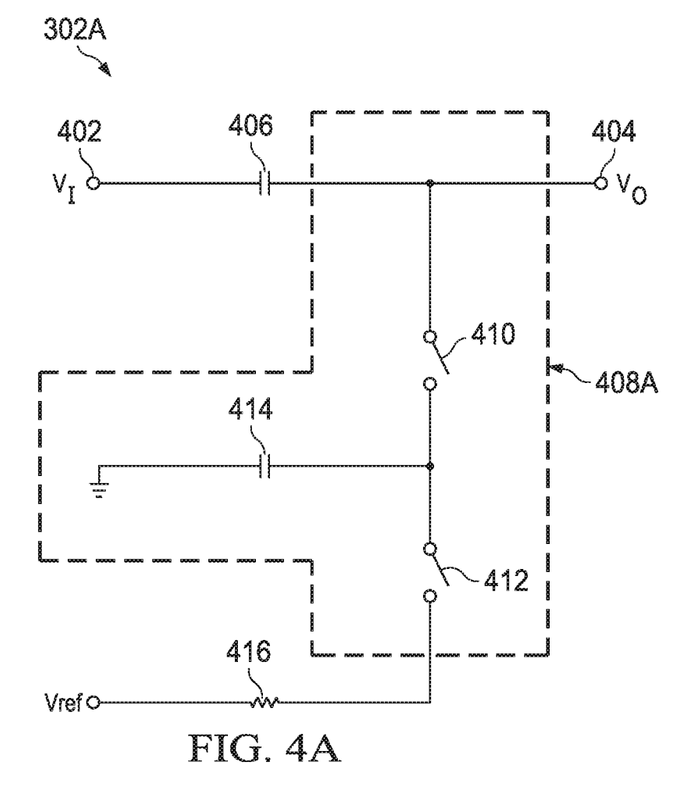
FIG. 4A illustrates an example high-pass filter, in accordance with embodiments of this disclosure.
Figure 4B:
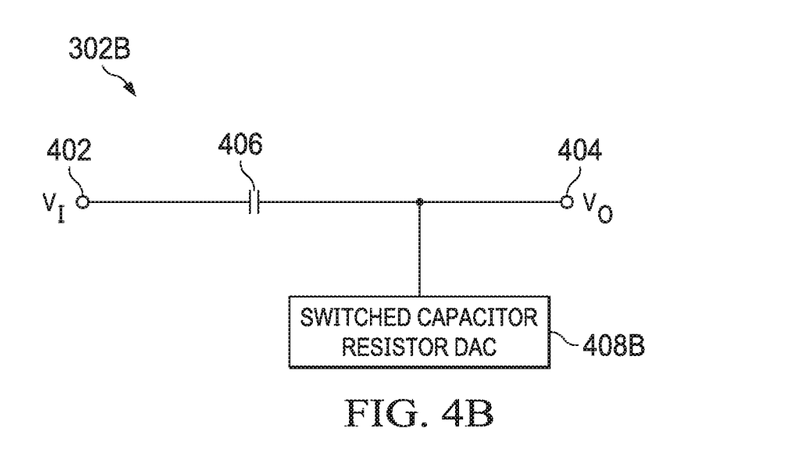
FIG. 4B illustrates another example high-pass filter, in accordance with embodiments of this disclosure.

Turning briefly to FIGS. 4A and 4B, example implementations of a high-pass filter 302 are illustrated. FIG. 4A depicts an example high-pass filter 302A in accordance with embodiments of this disclosure. In some embodiments, high-pass filter 302A of FIG. 4A may be used to implement high-pass filter 302 of FIG. 3. As shown in FIG. 4A, high-pass filter 302 may include an input 402 for receiving an input signal $V_i$, an output 404 for generating an output signal $V_o$, a capacitor 406 coupled between input 402 and output 404, and a switched-capacitor resistor 408A coupled to the output, such that input 402, output 404, capacitor 406, and switched-capacitor resistor 408A are arranged to generate output signal $V_o$ as a high-pass filtered version of input signal $V_i$. As also shown in FIG. 4A, switched-capacitor resistor 408A may be implemented by a first switch 410 coupled between a first terminal of switched-capacitor resistor 408A and an intermediate node, a second switch 412 coupled between a second terminal of switched-capacitor resistor 408A and the intermediate node, and a capacitor 414 coupled between the intermediate node and an electrical ground. Thus, controller 220 may be configured to control a switching frequency of switching of switches 410 and 412 of switched-capacitor resistor 408A in order to control a resistance of switched-capacitor resistor 408A.

As described in greater detail below, high-pass filter 302A may be configured to operate in a plurality of modes comprising at least a high-impedance mode in which controller 220 causes the switching frequency of switches 410 and 412 of switched-capacitor resistor 408A to be approximately equal to an integer multiple of a sample rate of an analog-to-digital converter (e.g., delta-sigma modulator 308a) receiving output signal $V_o$ and a low-impedance mode in which the resistance of switched-capacitor resistor 408A is significantly smaller than the resistance when in the high-impedance mode.

As shown in FIG. 4A, switched capacitor resistor 408A may be coupled between output 404 and a reference voltage $V_{ref}$, wherein controller 220 may be configured to control reference voltage $V_{ref}$ as described in greater detail below. As shown in FIG. 4A, a low-impedance resistor 416 may be coupled between switched capacitor resistor 408A and reference voltage $V_{ref}$, to provide a finite resistance in a quick-charge mode in which switches 410 and 412 are both closed, as described elsewhere in this disclosure. In some embodiments, resistor 416 may be placed in a different location within high-pass filter 302A (e.g., between output 404 and switch 410).

FIG. 4B depicts an example high-pass filter 302B in accordance with embodiments of this disclosure. In some embodiments, high-pass filter 302B of FIG. 4B may be used to implement high-pass filter 302 of FIG. 3. High-pass filter 302B of FIG. 4B may be similar in many respects to high-pass filter 302A of FIG. 4A. Accordingly, only main differences between high-pass filter 302B and high-pass filter 302A are discussed herein. The main difference between high-pass filter 302B and high-pass filter 302A is that a high-pass filter 302B includes a switched-capacitor resistor 408B in lieu of switched-capacitor resistor 408A and reference voltage $V_{ref}$ of high-pass filter 302A, wherein switched-capacitor resistor 408B is implemented using a switched-capacitor resistor digital-to-analog converter.

Turning again to FIG. 3, analog front end 203b of processing path 201b may include an inverting amplifier 306 which may amplify analog input signal ANALOG_IN by an inverting gain and communicate such amplified analog signal to ADC 215b. In some embodiments, inverting amplifier 306 may be configured to apply a multiplicative gain of less than unity to analog input signal ANALOG_IN. By attenuating higher-amplitude signals, a greater dynamic range for analog input signal ANALOG_IN may be achieved, in spite of conventional wisdom that would generally dictate that signal loss should be avoided in a low-noise system. In these and other embodiments, although not depicted in FIG. 3, inverting amplifier 306 may receive the output of high-pass filter 302 instead of the unfiltered analog input signal ANALOG_IN.

Although AFEs 203a and 203b are described above having a non-inverting gain and an inverting gain, respectively, each of processing paths 201 may have approximately the same cumulative gain. Those of skill in the art may appreciate that simply applying a digital gain with a negative sign in either of ADC 215a or ADC 215b will negate the opposite polarities of the gains of AFEs 203.

As depicted in FIG. 3, each ADC 215 may include a respective delta-sigma modulator 308 (e.g., delta-sigma modulators 308a and 308b), a respective digital gain element 310 (e.g., digital gain elements 310a and 310b), and respective high-pass filters 312 (e.g., high-pass filters 312a and 312b). Each delta-sigma modulator 308 may be configured to modulate an analog signal into a corresponding digital signal. As known in the art, each delta-sigma modulator 308 may include a respective modulator 316 (e.g., modulators 316a, 316b) and a decimator 318 (e.g., decimators 318a, 318b). Each digital gain element 310 may apply a gain to a digital signal generated by its associated delta-sigma modulator 308. Each high-pass filter 312 may high-pass filter a digital signal generated by its associated digital gain element, to filter out any direct-current offsets present in the digital signal. High-pass filter 312b may also compensate for high-pass filter 302 present in AFE 203a.

In addition, ADC 215a may comprise a latency matching element 314 to match any signal latencies between processing path 201a and processing path 201b, while ADC 215b may comprise a phase matching element 320 to account for any phase offset between processing path 201a and processing path 201b. For example, phase matching element 320 may dynamically compensate for any phase mismatch between processing paths 201a and 201b by varying a delay of at least one of processing path 201a and processing path 201b. In some embodiments, phase matching element 320 may comprise a high-pass filter.

In some embodiments, a magnitude of a gain of non-inverting amplifier 304 may be substantially larger than (e.g., significantly more than manufacturing tolerances, one or more orders of magnitude) a magnitude of a gain of inverting amplifier 306. In addition, in these and other embodiments, a magnitude of digital gain element 310b may be substantially larger than (e.g., significantly more than manufacturing tolerances, one or more orders of magnitude) a magnitude of a gain of digital gain element 310a. Consequently, in such embodiments, a first path gain equal to the product of the magnitude of the gain of inverting amplifier 306 and the magnitude of a gain of digital gain element 310b may be substantially equal (e.g., within manufacturing tolerances) to a second path gain equal to the product of the magnitude of gain of non-inverting amplifier 304 and the gain of digital gain element 310a. As a specific example, in some embodiments, the inverting gain of inverting amplifier 306 may be approximately −6 decibels, the non-inverting gain of non-inverting amplifier 304 may be approximately 20 decibels, the gain of digital gain element 310a may be approximately −26 decibels, and the gain of digital gain element 310b may be approximately 0 decibels.

Accordingly, each processing path 201 may be adapted to process a particular amplitude of analog input signal ANALOG_IN. For example, AFE 203a may be suited to process lower signal amplitudes, as non-inverting amplifier 304 may have a practically infinite input resistance, may have a relatively low level of input-referred noise as compared to inverting amplifier 306, and its larger gain may permit effective processing of smaller signals, but characteristics of AFE 203a may not be amenable to higher amplitudes. The high input resistance of non-inverting amplifier 304 may facilitate the use of a smaller capacitor area for high-pass filter 302 (as compared to traditional approaches for implementing high-pass filters) and thus may permit integration of circuitry of high-pass filter 302 into the same integrated circuit as non-inverting amplifier 304, inverting amplifier 306, ADC 215a, and/or ADC 215b. In addition, the ability to integrate circuitry into a single integrated circuit may allow for centralized control of the stimuli for switching between processing paths 201 by controller 220, and may allow for more direct timing control of the actual switching and transitioning between processing paths 201. For example, because circuitry is integrated into a single integrated circuitry, level detector 223 may receive an output of delta-sigma modulator 308b as an input signal, rather than receiving an output of ADC 215b.

On the other hand, AFE 203b may be suited to process higher signal amplitudes, as its lower gain will reduce the likelihood of signal clipping, and may provide for greater dynamic range for analog input signal ANALOG_IN as compared to traditional approaches.

As described above with respect to FIG. 2, controller 220 may comprise any suitable system, device, or apparatus for controlling a corner frequency of filter 230. For example, overload detector 221 that may determine whether or not a signal derivative of analog input signal ANALOG_IN (e.g., an output of a modulator 316a of delta-sigma modulator 308a, as shown in greater detail in FIG. 3) is likely to cause clipping or other distortion of digital output signal DIGITAL_OUT if a particular processing path (e.g., processing path 201a) is the dominant component of digital output signal DIGITAL_OUT, and communicate a resulting signal to path switching state machine 225, as described above with respect to FIG. 2. As another example, controller 220 may include a level detector 223 that may detect an amplitude of analog input signal ANALOG_IN or a signal derivative thereof (e.g., an output of a decimator 316b of delta-sigma modulator 308b, as shown in greater detail in FIG. 3) and communicate a signal indicative of such amplitude to path switching state machine 225, as described above with respect to FIG. 2.

Despite a designer's best efforts to match the first path gain and the second path gain, process variations, temperature variations, manufacturing tolerances, and/or other variations may lead to the first path gain and the second path gain being unequal. If switching between paths occurs when such path gains are unequal, signal artifacts may occur due to an instantaneous, discontinuous change in magnitude of the digital output signal between two gain levels. For example, in audio signals, such artifacts may include human-perceptible "pops" or "clicks" in acoustic sounds generated from audio signals.

In some embodiments, in order to reduce or eliminate the occurrence of such artifacts when switching selection between the digital output signal of ADC 215a and the digital output signal of ADC 215b, and vice versa, controller 220 may program an additional gain into one or both of processing paths 201 to compensate for differences in the first path gain and second path gain. This additional gain factor may equalize the first path gain and the second path gain. To illustrate, controller 220 may determine a scale factor indicative of the magnitude of difference (e.g., whether an intentional difference or unintentional mismatch) between the first path gain of processing path 201a and the second path gain of processing path 201b. The controller may determine the first path gain and the second path gain by comparing the digital output signals of each processing path to analog input signal ANALOG_IN or a derivative thereof. If such digital output signals have been filtered by a high-pass filter (e.g., high-pass filters 312), a direct-current offset between the signals may be effectively filtered out, which may be necessary to accurately compute the relative path gains. Controller 220 may determine the scale factor by calculating one of a root mean square average of the first path gain and the second path gain and a least mean squares estimate of the difference between the first path gain and the second path gain. Prior to switching selection between the first digital signal generated by ADC 215*a* and the second digital signal generated by ADC 215*b* (or vice versa), controller 220 may program an additional gain into one of processing paths 201 to compensate for the gain difference indicated by the scale factor. For example, controller 220 may calibrate one or both of the first path gain and the second path gain by applying a gain equal to the scale factor or the reciprocal of the gain factor (e.g., 1/gain factor), as appropriate. Such scaling may be performed by modifying one or both of digital gains 310. In some embodiments, controller 220 may apply the additional gain to the processing path 201 of the digital signal not selected as digital output signal DIGITAL_OUT. For example, controller 220 may apply the additional gain to processing path 201*a* when the digital signal of ADC 215*b* is selected as digital output signal DIGITAL_OUT and apply the additional gain to processing path 201*b* when the digital signal of ADC 215*a* is selected as digital output signal DIGITAL_OUT.

In some embodiments, the additional gain, once applied to a path gain of a processing path 201, may be allowed over a period of time to approach or "leak" to a factor of 1, in order to constrain the additional gain and compensate for any cumulative (e.g., over multiple switching events between digital signals of ADCs 215) bias in the calculation of the additional gain. Without undertaking this step to allow the additional gain to leak to unity, multiple switching events between paths may cause the gain factor to increase or decrease in an unconstrained manner as such additional gain, if different than unity, affects the outputs of the multiple paths and thus affects the calculation of the scaling factor.

As shown in FIG. 3, an example filter 230 may include a combiner 331, a low-pass filter 333, a combiner 335, and a cross-fader 327. Combiner 331 may receive a respective digital signal from each of processing paths 201 and determine a difference between the two digital signals. The difference may be filtered by a low-pass filter 333 to generate a filtered difference. In some embodiments, low-pass filter 333 may have a variable corner frequency, wherein the variable corner frequency is controlled based on a control signal generated by and communicated from a controller 220, as described above. The filtered difference output by low-pass filter 333 may be summed by combiner 335 with the digital signal output by one of the processing paths (e.g., processing path 201*a*) to generate a digital output signal.

A cross-fader 327 may receive the digital output signal received from combiner 335 and the digital signal output by one of the processing paths (e.g., processing path 201*b*) and output filtered digital output signal FILTER_OUT comprising a weighted average of the digital output signal and the digital signal output by processing path 201*b* based on a control signal generated by and communicated from a controller 220. In some embodiments, cross-fader 327 may not be present, in which case the digital output signal generated by combiner 335 may be communicated to driver 219 as filtered digital output signal FILTER_OUT.

In some embodiments, to reduce or eliminate artifacts from occurring when varying a corner frequency to adjust the relative dominance of processing paths 201 in digital output signal DIGITAL_OUT, controller 220 and cross-fader 327 may be configured to transition, continuously or in steps, filtered digital output signal FILTER_OUT from a first digital signal (e.g., output of processing path 201*b*) to the digital output signal generated by combiner 335, or vice versa, such that during such transition, digital output signal DIGITAL_OUT is a weighted average of the first digital signal and the digital output signal. For example, for decreases in the magnitude of the analog input signal, cross-fader 327 may transition from the first digital signal to the digital output signal generated by combiner 335 such that a weight of the digital output signal relative to the weight of the first digital signal increases during the transition. Similarly, for increases in the magnitude of the analog input signal, cross-fader 327 may transition from the digital output signal generated by combiner 335 to the first digital signal such that a weight of the first digital signal relative to the weight of the digital output signal increases during the transition.

The presence of filter 230 may be advantageous so as to decrease a minimum time needed to switch between selection of processing paths 201 as the dominant processing path contributing to filtered digital output signal FILTER_OUT. For example, high-pass filters in each of processing paths 201 (e.g., high-pass filter 302 and phase matching element 320) may contribute to differences between processing paths 201, particularly in response to impulsive sound events in analog input signal ANALOG_IN. Due to such differences, and in the absence of filter 230 to frequency-modulate between the paths, switching between processing paths 201 may lead to audio artifacts unless switching between paths is delayed. By including filter 230 in integrated circuit 105, such delay may be decreased over embodiments not having filter 230.

FIG. 3 also depicts controller 220 having a leakage correction state machine 340 and a corner frequency state machine 342. In operation, as described in greater detail below, leakage correction state machine 340 may receive information (e.g., signals DIFF_OFFSET and CM_OFFSET depicted in FIG. 3) indicative of voltage offsets present in and/or current leakage into non-inverting amplifier 304 and, based thereon, communicate one or more control signals (e.g., signals LEAKAGE_CORR shown in FIG. 3) to high-pass filter 302 to reduce or eliminate such leakage and/or offset. Furthermore, in operation, as described in greater detail below, corner frequency state machine 342 may receive information regarding switching between processing paths from path switching state machine 225 (e.g., signals LGP_FULLY_SEL and HGP_FULLY_SEL depicted in FIG. 3) and information regarding analog input signal ANALOG_IN (e.g., signal INP_LOW_SIGNAL depicted in FIG. 3) and, based thereon, communicate one or more control signals (e.g., signals HPF_CLK and HPK_QCHARGE depicted in FIG. 3) to high-pass filter 302 to control the corner frequency of high-pass filter 302 by way of controlling the switching frequency of one or more switched capacitors of one or more switched-capacitor resistors within high-pass filter 302. In addition, corner frequency state machine 342 may also, as described in greater detail below, communicate one or more control signals (e.g., signal CORNER_MOVE_TO_HGP_DONE depicted in FIG. 3) to path switching state machine 225 in order to indicate to path switching state machine 225 that corner frequency state machine 342 has completed modifying a corner frequency of high-pass filter 302, such that path switching state machine 225 may transition from processing path 201*b* to processing path 201*a* only once corner frequency state machine 342 has completed modifying a corner frequency of high-pass filter 302, in order to reduce audio artifacts associated with modifying the corner frequency.

Figure 5:
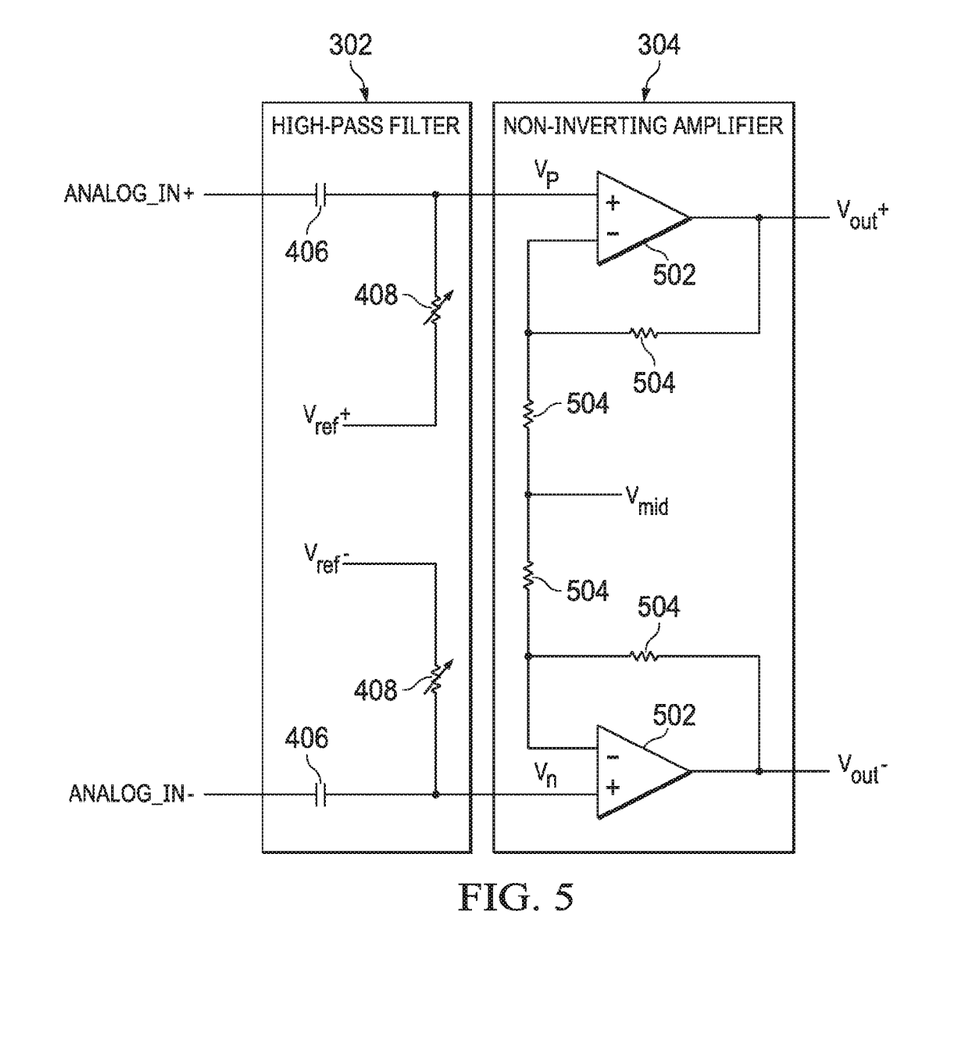
FIG. 5 illustrates detail of selected components of an analog front end, in accordance with embodiments of this disclosure.

To further illustrate the functionality of leakage correction state machine 340 and corner frequency state machine 342, reference is made to FIG. 5. For clarity of exposition, the foregoing discussion depicts the signal paths of system 100 as single-ended. However, in actual implementation, all or a portion of the signal paths of system 100 may be capable of processing differential signals. FIG. 5 depicts detail of selected components of AFE 201a in a differential signal implementation, in accordance with embodiments of this disclosure. As shown in FIG. 5, AFE 201a may include differential high-pass filter 302 and differential non-inverting amplifier 304. One of the differential inputs of high-pass filter 302 may receive differential input ANALOG_IN$^+$ filtered by a "top-side" high-pass filter comprising a capacitor 406 and a switched-capacitor resistor 408 to generate an intermediate signal $V_P$. One terminal of switched-capacitor resistor 408 may be coupled to reference voltage $V_{ref}^+$. The other differential input of high-pass filter 302 may receive differential input ANALOG_IN$^-$ filtered by a "bottom-side" high-pass filter comprising a capacitor 406 and a switched-capacitor resistor 408 to generate an intermediate signal $V_N$. One terminal of switched-capacitor resistor 408 may be coupled to reference voltage $V_{ref}^-$. Together, intermediate signals $V_P$ and $V_N$ form a filtered differential signal amplified by differential non-inverting amplifier 304. As known in the art, differential non-inverting amplifier 304 may include operational amplifiers 502 and resistors 504 arranged as shown to generate a differential output signal $V_{OUT}$ with differential outputs $V_{OUT}^+$ and $V_{OUT}^-$. As shown in FIG. 5, operation of non-inverting amplifier 304 may cause a voltage $V_{MID}$ to be present at an electrical node intermediate to the component single-ended non-inverting amplifiers that make up differential non-inverting amplifier 304.

In operating, leakage correction state machine 340 may be configured to correct for current leakage into one or both of the non-inverting inputs of operational amplifiers 502 that may result in a differential mode voltage offset and/or a common mode voltage offset occurring in AFE 203a. In processing path 201a, differential mode offset may be amplified by the gain of non-inverting amplifier 304, and thus, may be measured through delta-sigma modulator 308a. However, common mode offset may not be amplified by the gain of non-inverting amplifier 304, and must be measured in another manner. To determine the presence of common mode offset, leakage correction state machine 340 may receive (e.g., signal CM_OFFSET shown in FIG. 3) one or more of voltages $V_P$, $V_{MID}$, and $V_N$ and compare one of the voltages $V_P$, $V_{MID}$, and $V_N$ to a respective threshold. In some embodiments, such comparison may be made by comparison logic external to leakage correction state machine 340. In other embodiments, such comparison may be made by comparison logic internal to leakage correction state machine 340. Which of the voltages are used to measure common mode offset may be selected by a user of a device or designer of the device in which integrated circuit 105 resides. In determining whether common mode offset is present, leakage correction state machine 340 may vary the respective threshold (e.g., periodically increasing and/or decreasing the respective threshold), determine if the respective threshold is crossed as a result of the variance in the respective threshold, and determine therefrom whether common mode offset is present.

In the case of detection of common mode offset by leakage correction state machine 340, leakage correction state machine 340 may (e.g., as indicated by signal LEAKAGE_CORR) correct the offset by either increasing both of reference voltages $V_{ref}^+$ and $V_{ref}^-$ or decreasing both of reference voltages $V_{ref}^+$ and $V_{ref}^-$ as necessary to correct the offset. In the case of detection of common mode offset by leakage correction state machine 340, leakage correction state machine 340 may (e.g., as indicated by signal LEAKAGE_CORR) correct the offset by either increasing one (but not both) of reference voltages $V_{ref}^+$ and $V_{ref}^-$ or decreasing one (but not both) of reference voltages $V_{ref}^+$ and $V_{ref}^-$ as necessary to correct the offset.

In operation, corner frequency state machine 342 may be configured to control a switching frequency of switching of switches of switched-capacitor resistor 408 (e.g., switches 410 and 412 of switched-capacitor resistor 408A, or switches of the switched-capacitor resistor DAC of switched-capacitor resistor 408B) in order to control a resistance of switched-capacitor resistor 408. In some embodiments, corner frequency state machine 342 may be configured to control the operation of high-pass filter 302 to operate in a plurality of modes comprising at least a high-impedance mode in which the switching frequency of the switches of switched-capacitor resistor 408 are approximately equal to an integer multiple of a sample rate of an analog-to-digital converter (e.g., delta-sigma modulator 308a) receiving the filtered signal output by high-pass filter 302, and a low-impedance mode in which the resistance of switched-capacitor resistor 408 is significantly smaller than the resistance when in the high-impedance mode. When path switching state machine 225 has selected processing path 201b for generation of digital output signal DIGITAL_OUT (e.g., as indicated by signal LGP_FULLY_SELECTED), corner frequency state machine 342 may set a corner frequency of high-pass filter 302 to a maximum frequency (e.g., such frequency communicated on signal HPF_CLK) and enable a quick charging of the high-pass filter 302 (e.g., by appropriately setting signal HPF_QCHARGE). One example of quick charging is, with respect to high-pass filter 302A of FIG. 4A, closing both switches 410 and 412 such that output signal Vo of high-pass filter 302A charges to reference voltage $V_{REF}$.

When a condition for switching from selection of processing path 201b to selection of processing path 201a occurs (e.g., signal INP_LOW_SIGNAL indicating that a magnitude of analog input signal ANALOG_IN has fallen below a particular threshold), corner frequency state machine 342 may cause the corner frequency of high-pass filter 302 to decrease from the maximum frequency to a minimum frequency (e.g., via signal HPF_CLK), and disable quick charging. Once corner frequency state machine 342 has decreased the corner frequency of high-pass filter 302 to its minimum frequency, corner frequency state machine 342 may communicate a signal (e.g., signal CORNER_MOVE_TO_HGP_DONE) to path switching state machine 225, indicating to path switching state machine 225 that it may switch selection from processing path 201b to processing path 201a. While processing path 201a is selected for generating digital output signal DIGITAL_OUT (e.g., as indicated by signal HGP_FULLY_SEL), corner frequency state machine 342 may maintain the corner frequency at a constant frequency (e.g., the minimum frequency) and continue to disable quick charge.

Figure 6:
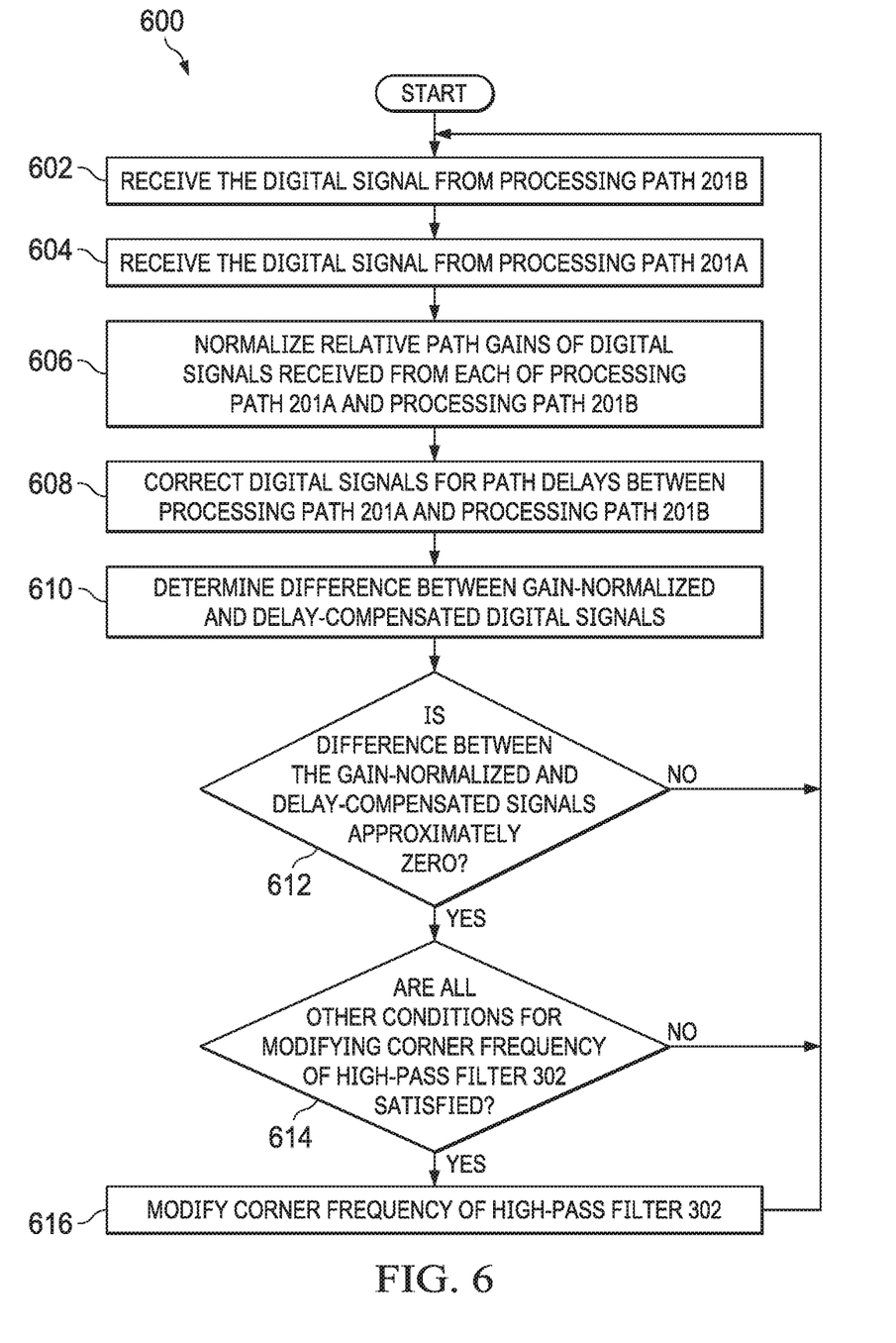
FIG. 6 illustrates a flow chart of an example method for controlling switching between corner frequencies of a high-pass filter, in accordance with embodiments of this disclosure.

FIG. 6 illustrates a flow chart of an example method 600 for controlling switching between corner frequencies of high-pass filter 302, in accordance with embodiments of this disclosure. According to some embodiments, method 600 may begin at step 602. As noted above, teachings of the present disclosure may be implemented in a variety of configurations of integrated circuit 105. As such, the preferred initialization point for method 600 and the order of the steps comprising method 600 may depend on the implementation chosen.

At step 602, corner frequency state machine 342 may receive the digital signal output by processing path 201b, or an intermediate digital signal from within processing path 201b that is indicative of the digital signal output by processing path 201b. Such digital signal may be indicative of the signal received by high-pass filter 302.

At step 604, corner frequency state machine 342 may receive the digital signal output by processing path 201a, or an intermediate digital signal from within processing path 201a that is indicative of the digital signal output by processing path 201a. Such digital signal may be indicative of the signal output by high-pass filter 302.

At step 606, corner frequency state machine 342 may normalize the relative path gains of the digital signals received from each of processing path 201a and processing path 201b. At step 608, corner frequency state machine 342 may modify one or both of such digital signals to correct for path delays between processing path 201a and processing path 201b. At step 610, corner frequency state machine 342 may determine a difference between such gain-normalized and delay-compensated digital signals, wherein such difference is indicative of a difference between the signal received by high-pass filter 302 and the signal output by high-pass filter 302.

At step 612, corner frequency state machine 342 may determine if the difference between the gain-normalized and delay-compensated signals is approximately zero (e.g., below a sufficiently small magnitude). If so, method 600 may proceed to step 614. Otherwise, method 600 may proceed again to step 602.

At step 614, corner frequency state machine 342 may determine if all other conditions for modifying the corner frequency of high-pass filter 302 (e.g., signal INP_LOW_SIGNAL indicating that a magnitude of analog input signal ANALOG_IN has fallen below a particular threshold) have been satisfied. If so, method 600 may proceed to step 616. Otherwise, method 600 may proceed again to step 602.

At step 616, corner frequency state machine 342 may cause modification in the corner frequency of high-pass filter 302 (e.g., via signal HPF_CLK shown in FIG. 3). After completion of step 616, method 600 may return to step 602.

Although FIG. 6 discloses a particular number of steps to be taken with respect to method 600, method 600 may be executed with greater or fewer steps than those depicted in FIG. 6. In addition, although FIG. 6 discloses a certain order of steps to be taken with respect to method 600, the steps comprising method 600 may be completed in any suitable order.

Method 600 may be implemented using corner frequency state machine 342, components thereof, and/or any other system operable to implement method 600. In certain embodiments, method 600 may be implemented partially or fully in software and/or firmware embodied in computer-readable media.

Although the foregoing contemplates determining that the difference between the input to high-pass filter 302 and the output from high-pass filter 302 is zero based on calculating a difference between two signals, in some embodiments, corner frequency state machine 342 may use other mathematical approaches to making such determination, including without limitation calculating a mathematical derivative of a signal within either of processing path 201a and processing path 201b.

In the high-pass architecture described above, physical space of a high-pass filter (e.g., high-pass filters 302, 302A, 302B) may be reduced by reducing the size/capacitance of the capacitor (e.g., capacitor 406) of such high-pass filter. However, to maintain a similar noise floor for the high-pass filter, the resistance (e.g., switched-capacitor resistor 408, 408A, 408B) of such high-pass filter must be increased by a greater factor magnitude than that of the decrease of the capacitor, which leads to an increase in the corner frequency of the high-pass filter. For example, for a given high-pass filter, reduction in its capacitance by a factor of 10 may require an increase in its resistance by a factor of 100 to maintain the same noise floor, which results in an increase of its corner frequency by a factor of 10. Thus, if a high-pass filter with such reduced capacitance and increased resistance is used, it may necessarily have a corner frequency high enough to undesirably filter out low-frequency information when in fact processing and output of such low-frequency information is desired.

Accordingly, to enable smaller capacitances in high-pass filter 302, cross-fader 327 or another component of filter 230 may be configured to, when processing path 201a is selected for generating digital output signal DIGITAL_OUT, combine spectral content of processing path 201b below the corner frequency of high-pass filter 302 with the output of processing path 201a in order to generate digital output signal DIGITAL_OUT, thus accounting for spectral content of the signal of processing path 201a below the corner frequency being filtered out by high-pass filter 302. Thus, cross-fader 327 or another component of filter 230 may be configured to control frequency-dependent weighted proportions of a first digital signal (e.g., generated by processing path 201b) and a second digital signal (generated by processing path 201a) to be combined into digital output signal DIGITAL_OUT based on a characteristic of analog input signal ANALOG_IN.

One potential disadvantage of employing a high-pass filter with a switchable corner frequency is that, if the difference between the input voltage (e.g., voltage $V_i$) and the output voltage (e.g., voltage $V_o$) of the high-pass filter is non-zero, abrupt changes in corner frequency of the high-pass filter may lead to a direct-current offset within the high-pass filter. To prevent such a direct-current offset, in some embodiments, corner frequency state machine 342 may be configured to determine a difference between an input signal (e.g., voltage $V_i$) and an output signal (e.g., voltage $V_i$) of high-pass filter 302 and switch between corner frequencies of the plurality of modes when the difference is approximately zero.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A system comprising:
a plurality of processing paths comprising:
a first processing path configured to generate a first digital signal based on an analog input signal; and
a second processing path configured to generate a second digital signal based on the analog input signal, the second processing path having a high-pass filter for filtering the analog input signal prior to the analog input signal being processed by the remainder of the second processing path, and the high-pass filter having a corner frequency; and
control circuitry for determining frequency-dependent weighted proportions of the first digital signal and the second digital signal to be combined into an output digital signal based on a characteristic of the analog input signal;
wherein the frequency-dependent weighted portions are configured such that the digital output signal includes spectral content of the first digital signal below the corner frequency to account for the spectral content of the second digital signal below the corner frequency being filtered by the high-pass filter.

2. The system of claim 1, wherein the high-pass filter comprises:
an input for receiving an input signal;
an output to generating an output signal;
a capacitor coupled between the input and the output; and
a switched-capacitor resistor coupled to the output; and
further wherein the input, the output, the capacitor, and the switched-capacitor resistor are arranged to generate the output signal as a high-pass filtered version of the input signal.

3. The system of claim 2, wherein the high-pass filter is configured to operate in a plurality of modes comprising at least:
a high-impedance mode in which the controller causes the switching frequency of switched capacitors of the switched-capacitor resistor to be approximately equal to an integer multiple of an analog-to-digital converter receiving the output signal; and
a low-impedance mode in which the resistance of the switched-capacitor resistor is significantly smaller than the resistance when in the high-impedance mode.

4. The system of claim 2, wherein the circuitry is further configured to control a switching frequency of switching of switched capacitors of the switched-capacitor resistor in order to control a resistance of the switched-capacitor resistor.

5. The system of claim 2, wherein the switched-capacitor resistor comprises a switched-capacitor resistor digital-to-analog converter.

6. The system of claim 1, wherein each of the frequency-dependent weighted proportions may vary between zero and 100 percent for a particular frequency or range of frequencies.

7. A method comprising:
processing an analog input signal with a first processing path to generate a first digital signal based on the analog input signal;
processing the analog input signal with a second processing path to generate a second digital signal based on the analog input signal, the second processing path having a high-pass filter for filtering the analog input signal prior to the analog input signal being processed by the remainder of the second processing path, and the high-pass filter having a corner frequency; and
determining frequency-dependent weighted proportions of the first digital signal and the second digital signal to be combined into an output digital signal based on a characteristic of the analog input signal;
wherein the frequency-dependent weighted proportions are configured such that the digital output signal includes spectral content of the first digital signal below the corner frequency to account for the spectral content of the second digital signal below the corner frequency being filtered by the high-pass filter.

8. The method of claim 7, wherein the high-pass filter comprises:
an input for receiving an input signal;
an output to generating an output signal;
a capacitor coupled between the input and the output; and
a switched-capacitor resistor coupled to the output; and
further wherein the input, the output, the capacitor, and the switched-capacitor resistor are arranged to generate the output signal as a high-pass filtered version of the input signal.

9. The method of claim 8, further comprising operating the high-pass filter in a plurality of modes comprising at least:
a high-impedance mode in which the controller causes the switching frequency of switched capacitors of the switched-capacitor resistor to be approximately equal to an integer multiple of an analog-to-digital converter receiving the output signal; and
a low-impedance mode in which the resistance of the switched-capacitor resistor is significantly smaller than the resistance when in the high-impedance mode.

10. The system of claim 8, further comprising controlling a switching frequency of switching of switched capacitors of the switched-capacitor resistor in order to control a resistance of the switched-capacitor resistor.

11. The system of claim 8, wherein the switched-capacitor resistor comprises a switched-capacitor resistor digital-to-analog converter.

12. The system of claim 7, wherein each of the frequency-dependent weighted proportions may vary between zero and 100 percent for a particular frequency or range of frequencies.

* * * * *

UNITED STATES PATENT AND TRADEMARK OFFICE
CERTIFICATE OF CORRECTION

PATENT NO. : 10,009,039 B1
APPLICATION NO. : 15/681023
DATED : June 26, 2018
INVENTOR(S) : Zanbaghi et al.

Page 1 of 2

It is certified that error appears in the above-identified patent and that said Letters Patent is hereby corrected as shown below:

In the Claims

Please amend Claim 2 as follows:
2. The system of Claim 1, wherein the high-pass filter comprises:
an input for receiving an input signal;
an output for generating an output signal;
a capacitor coupled between the input and the output; and
a switched-capacitor resistor coupled to the output; and
further wherein the input, the output, the capacitor, and the switched-capacitor resistor are arranged to generate the output signal as a high-pass filtered version of the input signal.

Please amend Claim 8 as follows:
8. The method of Claim 7, wherein the high-pass filter comprises:
an input for receiving an input signal;
an output for generating an output signal;
a capacitor coupled between the input and the output; and
a switched-capacitor resistor coupled to the output; and
further wherein the input, the output, the capacitor, and the switched-capacitor resistor are arranged to generate the output signal as a high-pass filtered version of the input signal.

Please amend Claim 10 as follows:
10. The method of Claim 8, further comprising controlling a switching frequency of switching of switched capacitors of the switched-capacitor resistor in order to control a resistance of the switched-capacitor resistor.

Please amend Claim 11 as follows:
11. The method of Claim 8, wherein the switched-capacitor resistor comprises a switched-capacitor resistor digital-to-analog converter.

Signed and Sealed this
Ninth Day of April, 2019

Andrei Iancu
*Director of the United States Patent and Trademark Office*

Please amend Claim 12 as follows:

12. The method of Claim 7, wherein each of the frequency-dependent weighted proportions may vary between zero and 100 percent for a particular frequency or range of frequencies.